US005729184A

United States Patent [19]

Paxman et al.

[11] Patent Number: 5,729,184

[45] **Date of Patent: *Mar. 17, 1998**

[54] TAP FOR EXTRACTING ENERGY FROM TRANSMISSION LINES USING IMPEDANCE TRANSFORMERS

[75] Inventors: Wesley R. Paxman, Richardson; Richard P. Stein, Princeton, both of Tex.

[73] Assignee: Andrew Corporation, Orland Park, Ill.

[ * ] Notice: The term of this patent shall not extend beyond the expiration date of Pat. No. 5,689,218.

[21] Appl. No.: 640,546

[22] Filed: May 2, 1996

Related U.S. Application Data

[63] Continuation-in-part of Ser. No. 595,362, Feb. 1, 1996.

[51] Int. Cl.[6] ........ H03H 7/48

[52] U.S. Cl. ........ 333/125; 333/27; 333/33

[58] Field of Search ........ 333/24 R, 24 C, 333/27, 32, 33, 100, 124, 125, 131, 136

[56] References Cited

U.S. PATENT DOCUMENTS

| | | | |
|---|---|---|---|
| 2,805,399 | 9/1957 | Leeper | 333/136 |
| 2,891,222 | 6/1959 | Freen | 333/124 |
| 3,662,294 | 5/1972 | Jacobs et al. | 333/33 |
| 4,335,364 | 6/1982 | Schmitz et al. | 333/33 |
| 4,951,012 | 8/1990 | Oppelt et al. | 333/33 |
| 5,281,933 | 1/1994 | Chamberlin | 333/132 |
| 5,384,558 | 1/1995 | Maruhashi | 333/33 |

OTHER PUBLICATIONS

"Design of Broadband Passive Components With Ferrites," M. MacDonald, Microwaves & RF, Oct. 1993 pp. 81–86, 132.

"Some Broad-Band Transformers," C.L. Ruthroff, Proceedings of the IRE, vol. 47, Aug. 1959, pp. 1337–1342.

Chapter 5 of the Book by E.C. Snelling and A.D. Giles *Ferrites for Inducttors and Transformers*, Research Studies Press, 1983.

G. Guanella, "New Method of Impedance Matching in Radio-Frequency Circuits," *The Brown Boveri Review* vol. 31, Sep. 1944, pp. 327–329

Ersch Rotholz, "Transmission-Line Transformers, IEEE Transactions on Microwave Theory and Techniques", vol. MTT-29, No. 4, Apr. 1981, pp. 327–331.

Alex J. Burwasser, "Taking the Magic Out of the 'Magic Tree'" RF Design May/Jun. 1983, pp. 44–60.

"Mixers in Microwave Systems," Bert Henderson, Microwave System News, Oct., 1989, pp. 4, 64–65, 68–69, 72–74.

"Mixers in Microwave Systems," Bert Henderson, Microwave System News, Nov., 1989, pp. 4, 71–75.

*Primary Examiner*—Robert Pascal
*Assistant Examiner*—Barbara Summons
*Attorney, Agent, or Firm*—Arnold, White & Durkee

[57] ABSTRACT

A tap for coupling electromagnetic energy between first and second coaxial cables. The tap comprises a an impedance transformer, means for connecting said impedance transformer to said first cable, and means for connecting said impedance transformer to said second cable.

3 Claims, 6 Drawing Sheets

TAP FOR EXTRACTING ENERGY FROM TRANSMISSION LINES USING IMPEDANCE TRANSFORMERS

RELATED PATENT APPLICATIONS

This is a continuation-in-part of U.S. patent application Ser. No. 08/595,362, filed Feb. 1, 1996.

FIELD OF INVENTION

The present invention relates generally to taps which extract electromagnetic energy from transmission lines and specifically taps which extract electromagnetic energy from transmission lines and which couple the electromagnetic energy to other transmission lines.

SUMMARY OF THE INVENTION

It is an object of the invention to provide a method of transforming the load impedance of a tap such that the tap engenders low losses in the host cable and operates over broad bandwidths.

Another object of the invention is to provide an assembly for the tap that is inexpensive to manufacture, rugged in operation, and does not require a splice.

A further object of the invention is to provide flexibility when selecting parameters so as to allow couplings from below 6 dB to above 18 dB while maintaining the same or a wider bandwidth.

Another object of the invention is to provide a broadband input impedance for taps that allow their use with 30 to 150 ohm coaxial cable systems.

Still another object of the invention is to provide a tap that is not limited to attachment to single size of cable but can be attached to cables with varied diameters.

Yet another object of the invention is to provide a tap which operates at a certain frequency with a host cable but causes minimum interference with the host cable at other frequencies.

Another object of the invention is to provide a tap that generates very low intermodulation products.

Other aspects and advantages of the present invention will become apparent upon reading the following detailed description and upon reference to the drawings.

In accordance with the present invention, the foregoing objectives are realized by a tap for coupling electromagnetic energy between first and second coaxial cables. The tap comprises an impedance transformer, means for connecting the impedance transformer to the first cable, and means for connecting the impedance transformer to the second cable.

DESCRIPTION OF THE EMBODIMENTS

Figure 1A:
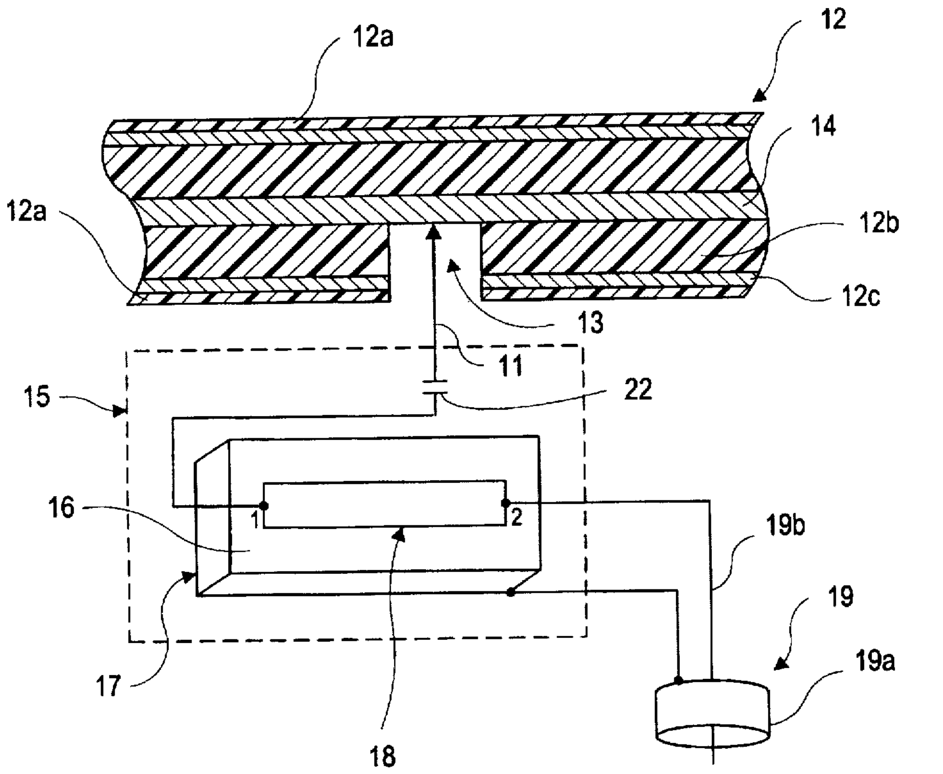
FIG. 1*a* is a schematic diagram of a tap according to the principles of the invention.

FIG. 1*a* shows a tap for coupling electromagnetic energy between coaxial cable transmission lines. Although coaxial transmission lines are shown, it will be understood that any kinds of transmission lines can be tapped by the invention. A hole 13 is drilled through the outer jacket 12*a*, outer conductor 12*c*, and dielectric 12*b* of a host coaxial feeder cable 12 to a central conductor 14. The hole 13 is drilled such that the hole exposes the central conductor 14. Penetration into the central conductor 14 when the hole is drilled is preferably minimal.

For the purpose of extracting electromagnetic energy from the central conductor 14 and conducting this energy into the tap, a probe 11 is placed in the hole 13. Preferably, the probe 11 is spring loaded to bias the probe into engagement with the central conductor 14. Insulating material, such as heat shrink tubing (not illustrated), can be placed over the probe 11 to prevent the probe 11 from contacting the outer conductor 12*c* of the host cable 12. The host cable can be any form of coaxial cable such as radiating or non-radiating coaxial cable.

In order to couple the extracted energy to the output of the tap, an impedance transformer 15 is attached between the probe 11 and an output RF connector 19. According to the embodiment of FIG. 1*a*, the impedance transformer 15 comprises a high impedance microstrip transmission line. The impedance transformer 15 then operates as an impedance transformer with a center frequency which is a function of the length of the microstrip transmission line. The transmission line can be low impedance, the same impedance, high impedance, or of varying (high, same, low) impedance, although high impedance lines are most often described here.

Specifically, substrate 16 has a conductive trace 18 on the top side and a ground plane 17 on the back side. This construction creates a microstrip transmission line. End 1 of trace 18 is connected to capacitor 22 which is in turn connected to the output of probe 11. The other end 2 of trace 18 is connected to the end of inner conductor 19*b*. The capacitor 22 serves as a direct current (DC) block and also enhances frequency selectivity, but is not required for operation. Consequently, the capacitor may be omitted and end 1 may be connected directly to probe 11. To provide shielding, the ground plane 17 is connected to the shield 19*a* of the connector 19.

For the purpose of attaching the tap to another cable and completing the coupling of the extracted energy from the host cable 12 to a second cable, output connector 19 is connected to the impedance transformer 15 by attaching end 2 of transmission line 18 to the inner conductor 19*b* of connector 19 and connecting the ground plane 17 to the shield 19*a* of connector 19. Connector 19 is preferably adapted for use with RF cables.

When the second coaxial cable is connected to connector 19, the outer conductor of the second cable is electrically coupled to the shield 19*a* of connector 19 and the inner conductor of the second cable is electrically coupled to the inner conductor 19*b* of connector 19.

A capacitor 22 can be electrically coupled between probe 11 and coupler 15 in order that undesired signals in the host cable 12 will not be disturbed by the tap. By choosing a capacitor 22 with a desired self-resonance frequency, dc current is not passed while RF signals are passed at the self-resonance frequency. Intermodulation products are also low.

As mentioned above, a second coaxial cable either radiating coaxial cable, or non-radiating coaxial cable, can be attached to connector 19. Of course, any form of impedance transformer, including Ruthroff transformers, Guanella transformers, stripline transmission lines, microstrip transmission lines, lumped element equivalent transmission lines, or multiple transmission lines, could be used. In addition, the match at the second coaxial cable could be improved by resistive or other matching means, and the selectivity at the input could be enhanced by proper selection of the capacitor.

The tap described in FIG. 1*a* will extract from more than 25 percent to less than 1 percent of the energy from a host coaxial cable 12 while adding a minimum line loss to the host. This tap can be configured to operate at frequencies exceeding 4 GHz while maintaining a usable band width of +/−50 percent of the center frequency. The microstrip transmission line of FIG. 1*a* represents one possible configuration of an impedance transformer.

The tap described above results in low losses and operates across a wide frequency band. It provides a broadband input impedance that allows it to be used in 30 to 150 ohm coaxial systems. The single hole used by the system is simple and economical to use. The tap also generates very low intermodulation products when nonlinear components are not used. The tap (as well as those described below) makes possible couplings from 3 dB to over 20 dB while maintaining the same or wider bandwidth. The tap presented minimum degradation of performance while maintaining uniform coupling over a broad bandwidth.

The tap shown in FIG. 1*a* does not employ dc coupling between the outer conductor 12*c* of the host cable 12 and the shield 19*a* of the connector 19. Rather, it is believed that the outer conductor 12*c* of the host cable 12 and the shield 19*a* of the connector 19 may be capacitively coupled.

Figure 1B:
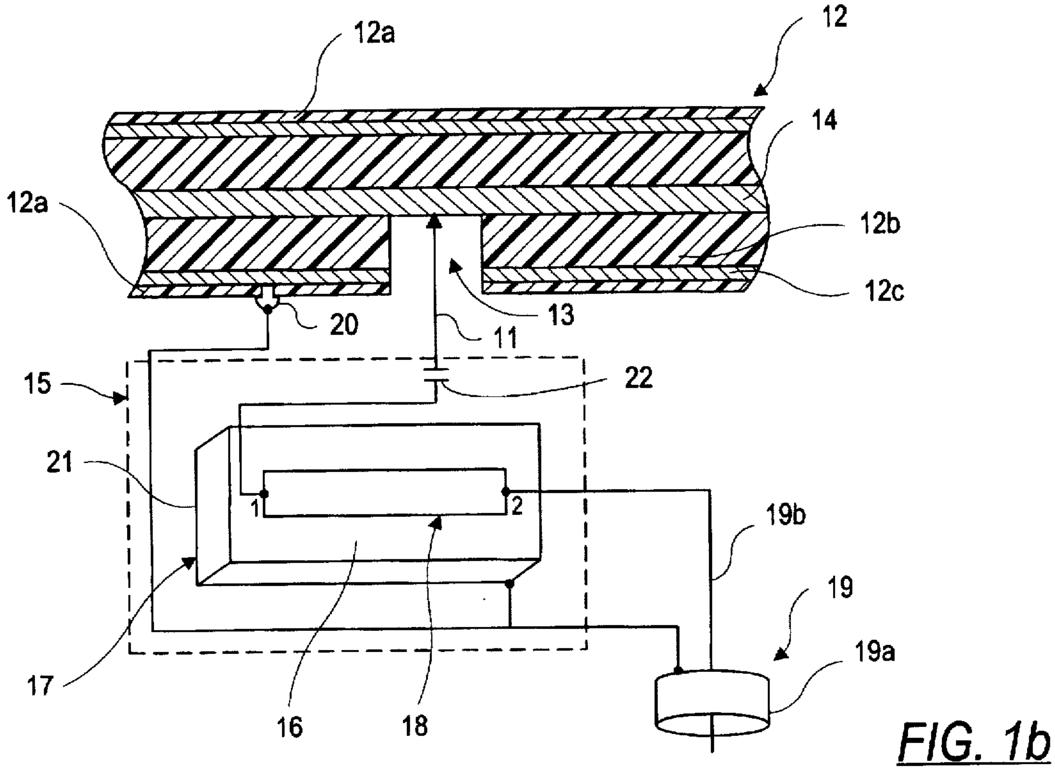
FIG. 1*b* is a schematic diagram of a tap according to the principles of the invention.

FIG. 1*b* illustrates a tap similar to that of FIG. 1*a* but having dc coupling between the outer conductor 12*c* of the host cable 12 and the shield 19*a* of the connector 19. As shown, a wire 21 is electrically coupled between the shield 19*a* of the connector 19 and the outer conductor 12*c* of the host cable 12, for example, via a self-tapping screw 20 that makes electrical contact with the outer conductor 12*c*.

Figure 1C:
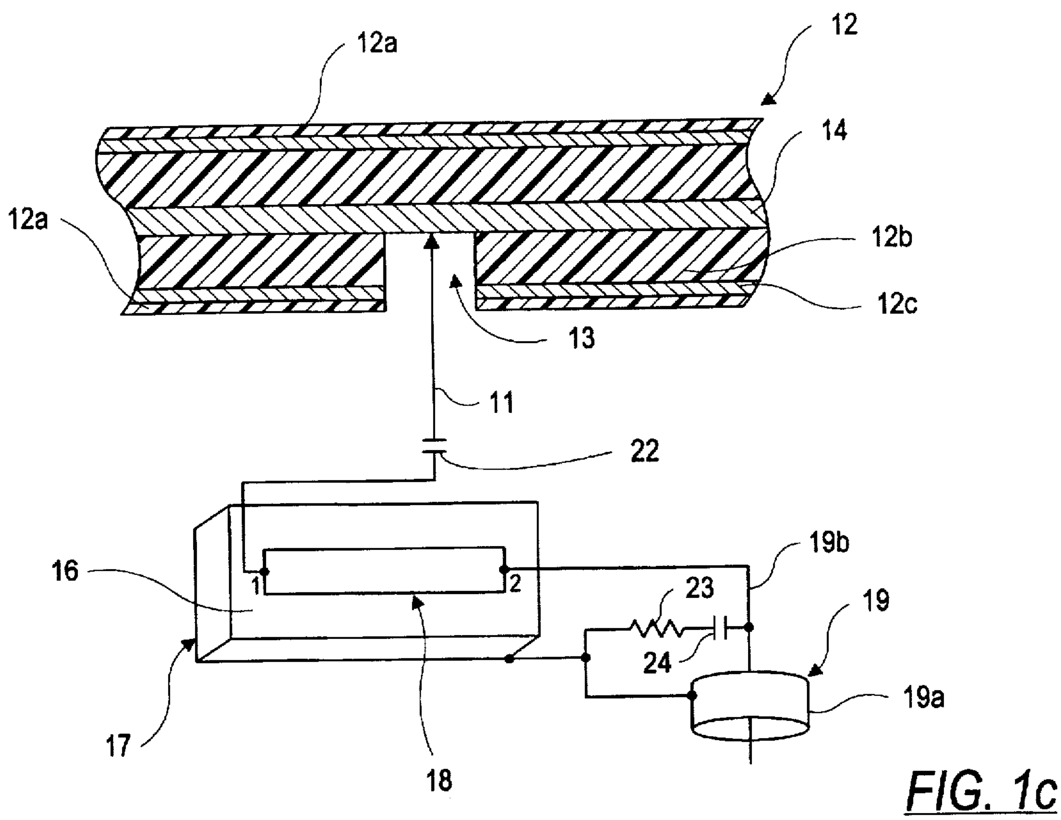
FIG. 1*c* is a schematic diagram of a tap according to the principles of the invention.

FIG. 1*c* shows a resistor 23 connected between the shield 19*a* of connector 19 (electrically, ground plane 17) and through capacitor 24 to the inner conductor 19*b* of connector 19 (electrically, at end 2). The resistor 23, having, for example, a value of 75 ohms, may be used as illustrated in FIG. 1*c*. However, in alternative embodiments such as FIGS. 1*a* and 1*b*, the resistor may be omitted. The resistor 23 is used to increase the return loss of the tap port by lowering the input impedance of the connector. For example, proper sizing of this resistor can result in return losses nearing 20 dB. Capacitor 24 serves a dual purpose as DC block, and as a frequency selective element to improve the selectivity of the tap.

Figure 1D:
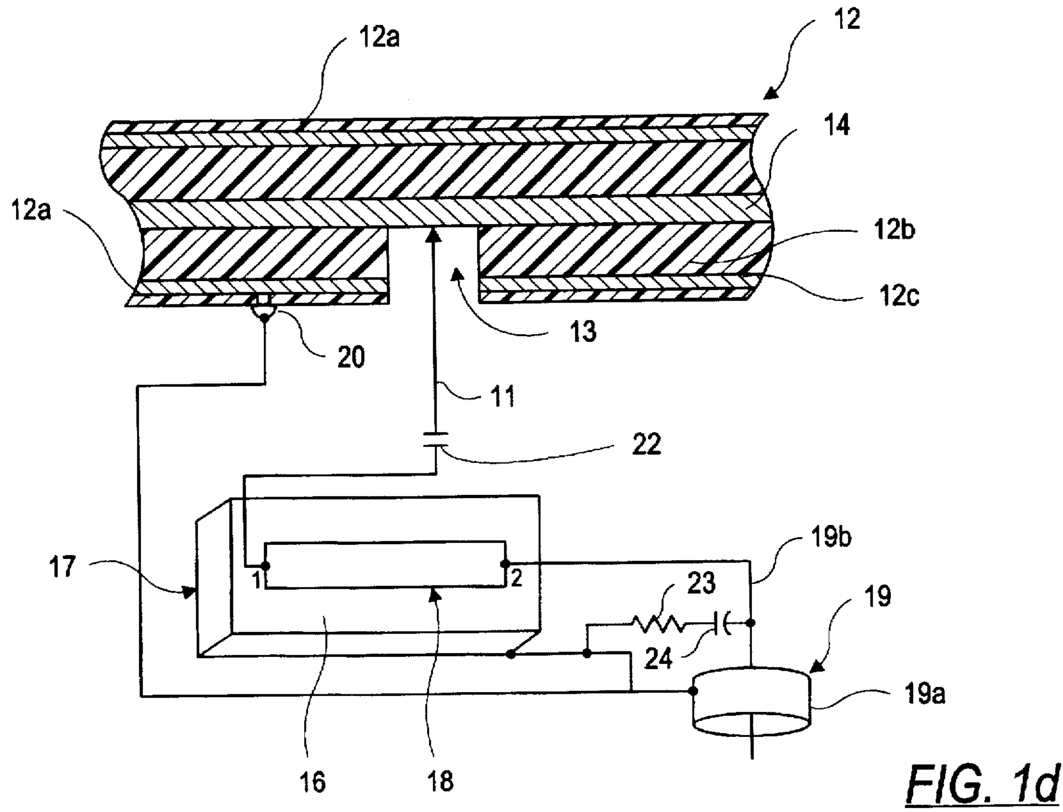
FIG. 1*d* is a schematic diagram of a tap according to the principles of the invention.

FIG. 1*d* shows an embodiment employing dc coupling of the shield and a resistor 23. In all of the embodiments of FIGS. 1*a*–1*d*, the capacitor may be eliminated if desired.

Figure 2B:
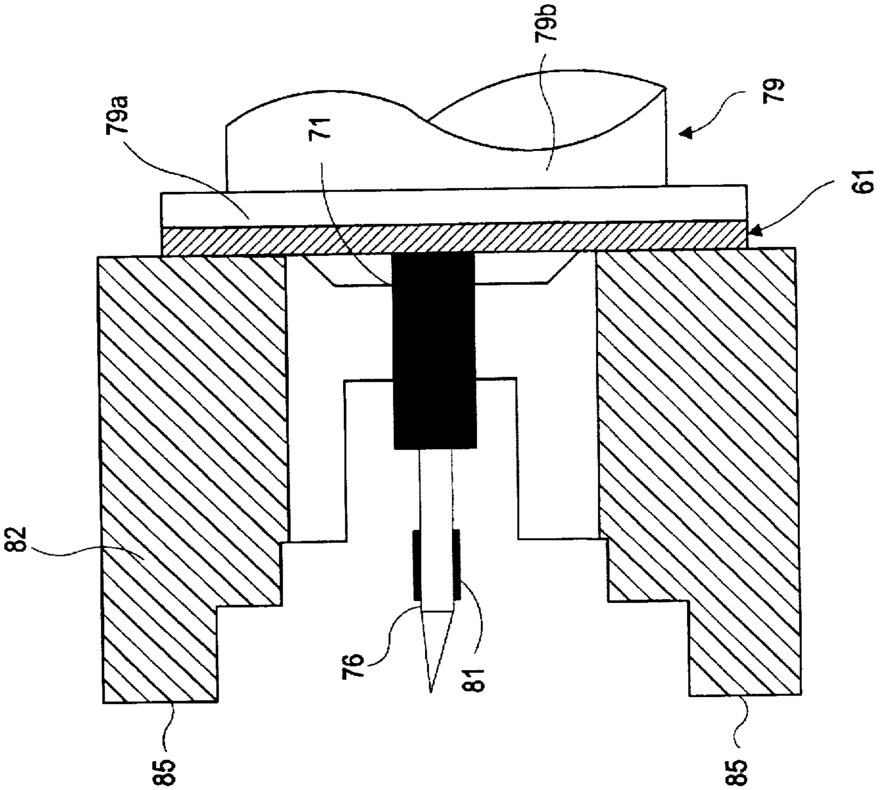
FIG. 2*b* shows a cross-sectional view of the tap assembly of FIG. 2*a* according to principles of the invention.
Figure 2A:
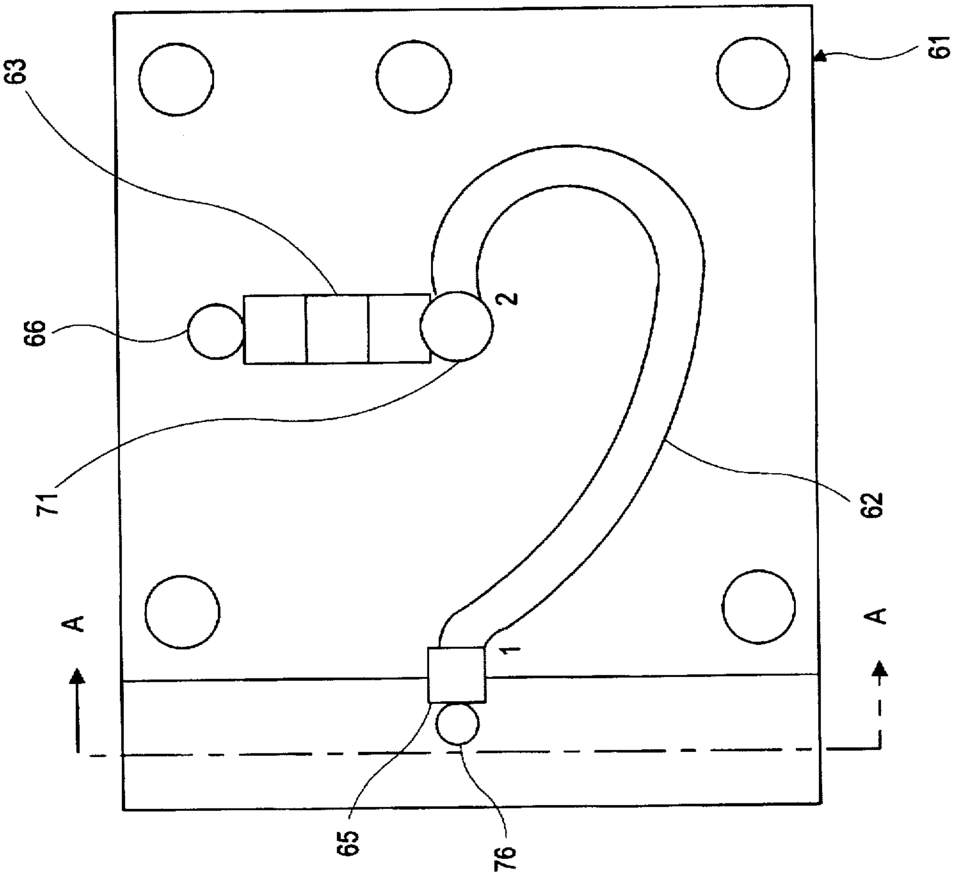
FIG. 2*a* shows a bottom of the tap assembly according to principles of the invention.

FIG. 2*a* shows the bottom view of a circuit board assembly 61 mounted on a housing. (The traces shown may not be actually visible through the housing.)

FIG. 2*b* shows a cross-sectional view of the assembly 61 of FIG. 2*a* along line A—A. As shown, probe 76 is housed in an outer plastic body 82. The body 82 may be constructed of nylon, teflon, or delfin or any low-loss material. Probe 76 is preferably a spring probe such as a SOB302.5G 0.660 inch probe available from Interconnect Devices Inc., Kansas City, Kans. If a spring pin is used as a probe 76, care should be taken that the base of the spring pin is not in contact with the connector 79. The RF connector 79 shown in FIG. 2*a* is an type "N" connector and consists of a flange connector 79*a* and circular portion 79*b*. Although an "N" type is illustrated, any connector capable of conducting RF signals can be used. End 2 of transmission line 62 (see FIG. 2*a* ) is electrically coupled to the center conductor 71 of the connector 79 while end 1 of a transmission line 62 is electrically coupled to the probe 76. A DC blocking capacitor 65 may be used if there is a DC current flowing in either cable.

Figure 2C:
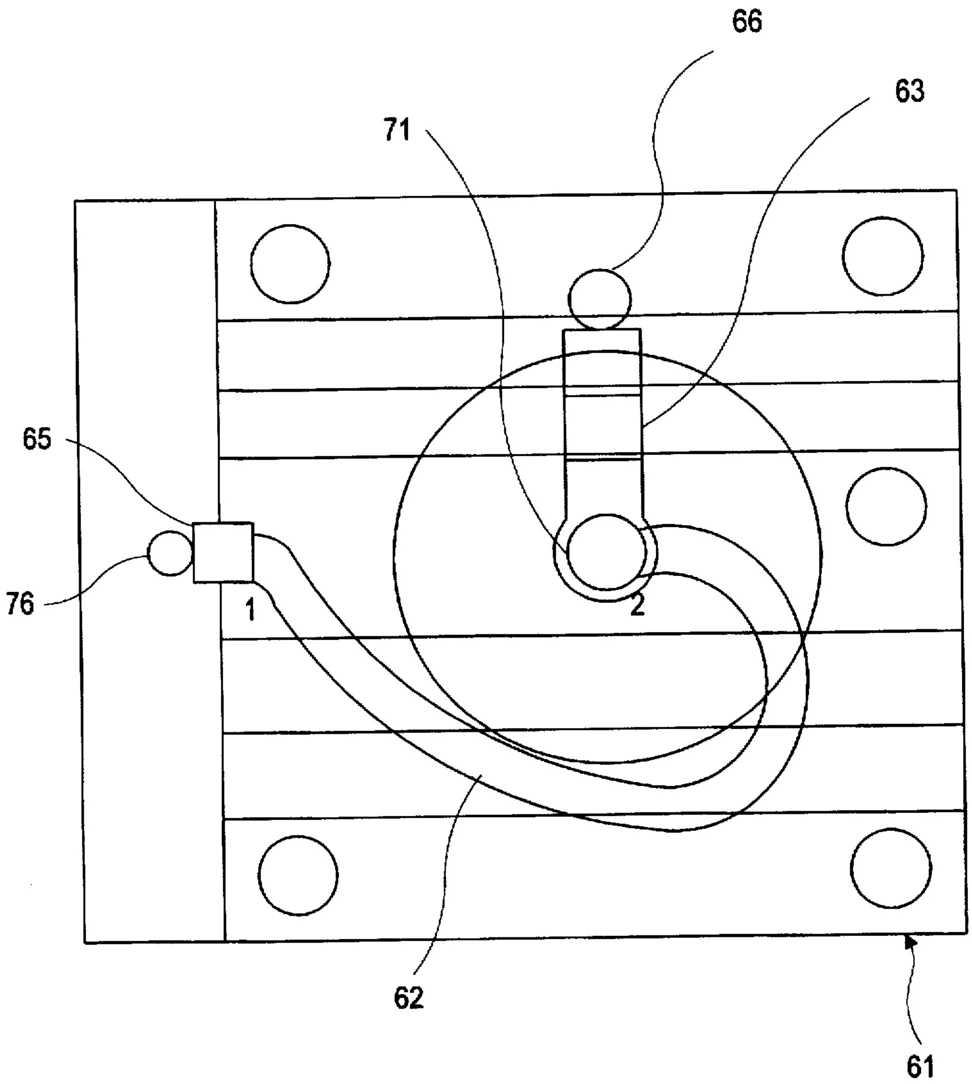
FIG. 2*c* shows a top of the tap assembly according to principles of the invention.

FIG. 2*c* shows a top view of the circuit board assembly 61 assembled for the tap described above in reference to FIG. 1*a*. DC blocking capacitor 65 if used connects probe 76 to transmission line 62. Transmission line 62 is connected to the center conductor 71 of the output connector 79 (not shown). Between center conductor 71 and the ground plane 66 is output matching resistor 63. The ground plane via tube 66 runs from the top side of the circuit board to the backside ground plane.

A housing surrounds the host cable. As will be described below (see FIG. 3*b*), the housing actually consists of two parts to form a clamp, a first part (illustrated in FIG. 2*b*) and a second part which connects to left surface 85 and which fits around the host cable and clamps the host cable between the two housing parts.

The taps presented in FIGS. 2*a*, 2*b*, and 2*c* operate with 30 ohm to 150 ohm systems. As described above, probe 76 is spring-loaded as a convenient method of insuring continuous contact to the host cable center conductor. The impedance of the connector and host cable is of small consequence. A piece of heat shrink tubing 81 can be placed over the probe 76 as a matter of assembly convenience to prevent contact of the probe 76 with the host cable outer conductor.

Figure 3C:
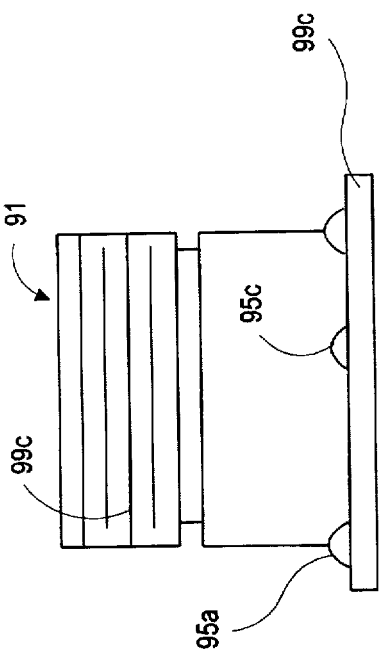
FIG. 3*c* shows a view of a connector according to principles of the invention.
Figure 3B:
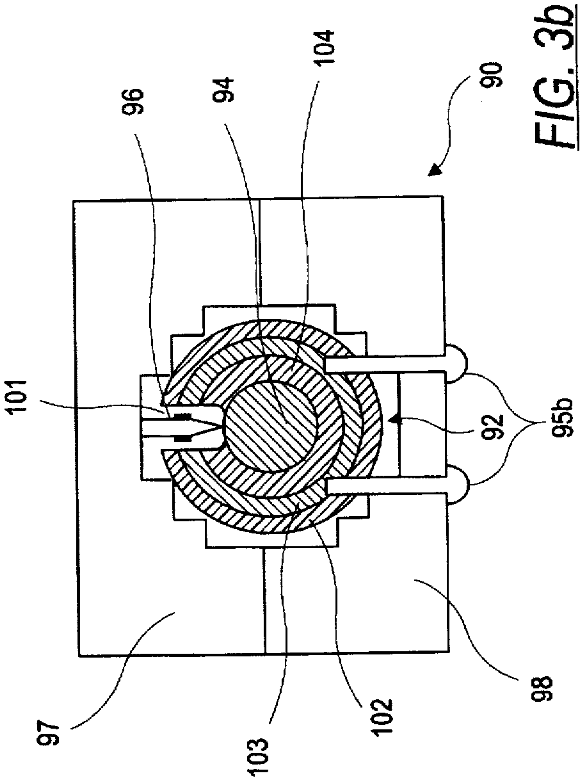
FIG. 3*b* shows an end cross-sectional view of the tap assembly of FIG. 3*a* showing the interior of the assembly according to principles of the invention.
Figure 3A:
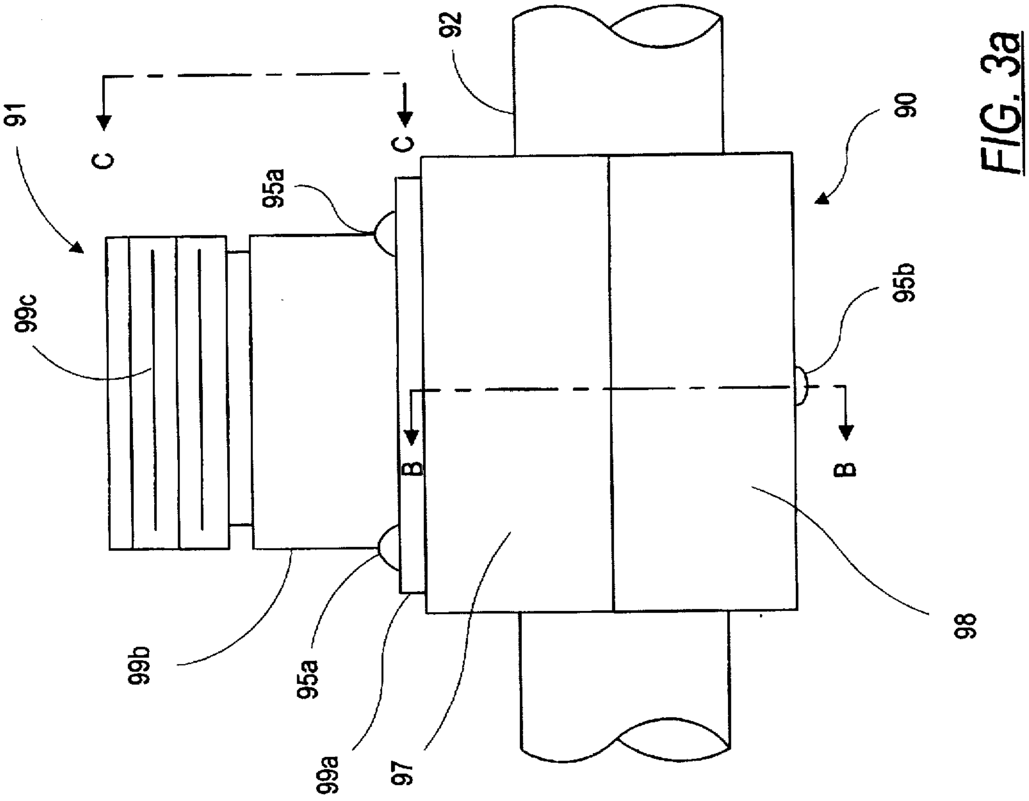
FIG. 3*a* is a side view of a tap assembly according to principles of the invention.
Figure 4A:
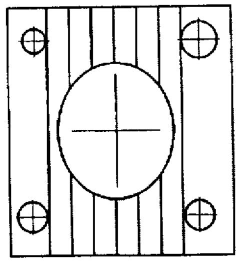
Figure 4B:
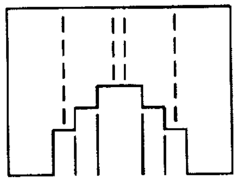
Figure 4C:
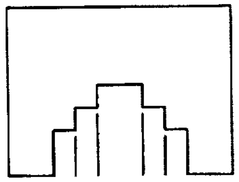
Figure 4D:
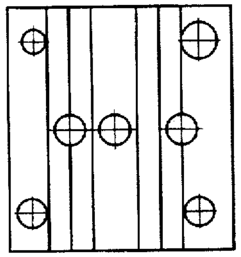

FIG. 3*a* depicts the outer body of tap assembly 90 connected to cable 92. As shown, the tap assembly 90 comprises an upper part 97 and a lower part 98. Parts 97 and 98 are adapted to fit over opposite sides of cable 92 to clamp cable 92 between the top part 97 and bottom part 98 of the housing.

Screws 95*a* are placed through connector flange 99*a* to attach the connector 91 to the tap assembly 90. These screws are preferably #4×1" self tap screws and may penetrate through top part 97 into bottom part 98 to attach the two parts. Screw threads 99*c* of the connector 91 permit the connector 91 to attach to a second cable. Support portion 99*b* separates threads 99*c* and flange 99*a*.

FIG. 3*b* is a cross-sectional view of the assembly of FIG. 3*a* along line B—B showing how a probe 96 contacts the central conductor 94 of the host cable 92. The probe 96 is placed in hole 101 which is drilled through the outer jacket 102, outer conductor 103, and dielectric 104 of the host cable 92. The tap assembly 90 consists an upper part 97 and a lower part 98. Parts 97 and 98 are adapted to fit over opposite sides of cable 92 and to clamp the cable 92 between the top part 97 and the bottom part 98 of the housing. Probe 96 is mounted on one of the two parts 97 or 98 of the housing so that the clamping of the two parts against the cable 92 holds probe 96 against the central conductor 94 of the cable 92. DC coupling of shields, as discussed with reference to FIG. 1*b*, if required, is accomplished by using screw 95*c* (see FIG. 3*c*) to electrically join the host cable outer conductor 103 to the outer conductor of the second cable. Screw 95*c* may be a self-tapping screw that penetrates outer jacket 102 and electrically connects outer conductor 103.

Screws 95*b* preferably are screwed through the bottom of assembly 90 to prevent the cable inside the assembly from rotating. Screws 95*b* are preferably #4×⅝" self tap screws. The screws 95*b* completely penetrate the jacket 102 and penetrate preferably one-eighth inch into the outer conductor 103 of the cable 92.

FIG. 3*c* shows another view of the connector 91 along line C—C of FIG. 3*a*. Screws 95*a* attach connector 91 to tap assembly 90. Screw 95*c* electrically couples the shield of the connector 91 and the outer conductor of the host cable 92.

The tap assemblies depicted in FIGS. 2*a*, 2*b*, 2*c*, 3*a*, 3*b*, and 3*c* can be adapted to attach to coaxial cables of a variety of sizes including, for example, cables above three inches in diameter. Furthermore, these assemblies are rugged, suitable for a wide range of applications, and do not require a splice. The assemblies are also easy and inexpensive to manufacture since they contain a minimum number of parts.

While the present invention has been described with reference to one or more particular embodiments, those skilled in the art will recognize that many changes may be made thereto without departing from the spirit and scope of the present invention, which is set forth in the following claims.

We claim:

1. A coaxial tap for coupling electromagnetic energy between first and second coaxial cables, said tap comprising:

a probe extending through the outer conductor of the first cable into contact with the inner conductor of the first cable, an impedance transformer connecting the probe with the inner conductor of the second cable for coupling electromagnetic signals between the first and second cables, said impedance transformer including a ground plane, said impedance transformer contained in a single housing;

a connector coupled to said second cable, said connector having a shield;

shielding means for shielding the ground plane of the transformer, said shielding means connected between said ground plane and said shield of said connector;

a capacitor coupled to said shield of said connector; and a resistor connected to said capacitor and to said ground plane for increasing the return loss by lowering the input impedance of the connector.

2. A coaxial tap for coupling electromagnetic energy between first and second coaxial cables, said tap comprising:

a probe extending through the outer conductor of the first cable into contact with the inner conductor of the first cable, an impedance transformer circuit board connecting the probe with the inner conductor of the second cable for coupling electromagnetic signals between the first and second cables, said impedance transformer including a ground plane, said impedance transformer comprised of a ground plane and a conductive trace;

an isolation capacitor connected to said probe and impedance transformer;

a connector coupled to said second cable, said connector having a shield;

dc coupling means for shielding said ground plane of said transformer, said dc coupling means connected between said ground plane and said shield of said connector;

a shielding capacitor coupled to said shield of said connector; and a resistor connected to the capacitor and to the ground plane for increasing the return loss by lowering the input impedance of the connector.

3. The coaxial tap of claim 2 wherein said dc coupling means is additionally coupled to said first cable using a self-tapping screw.

* * * * *